United States Patent
Bartray et al.

(10) Patent No.: US 7,471,373 B2
(45) Date of Patent: Dec. 30, 2008

(54) LITHOGRAPHIC APPARATUS WITH PATTERNING DEVICE POSITION DETERMINATION

(75) Inventors: Petrus Rutgerus Bartray, Ysselsteyn (NL); Wilhelmus Josephus Box, Vennenstraat 3A (BE); Dominicus Jacobus Petrus Adrianus Franken, Veldhoven (NL); Bernardus Antonius Johannes Luttikhuis, Nuenen (NL); Engelbertus Antonius Franciscus Van Der Pasch, Oirschot (NL); Marc Wilhelmus Maria Van Der Wijst, Veldhoven (NL); Marc Johannes Martinus Engels, Helden (NL)

(73) Assignee: ASML Netherlands B.V., Veldhoven (NL)

( * ) Notice: Subject to any disclaimer, the term of this patent is extended or adjusted under 35 U.S.C. 154(b) by 755 days.

(21) Appl. No.: 10/876,786

(22) Filed: Jun. 25, 2004

(65) Prior Publication Data
US 2005/0024611 A1 Feb. 3, 2005

(30) Foreign Application Priority Data
Jun. 27, 2003 (EP) ................................. 03077013

(51) Int. Cl.
*G03B 27/42* (2006.01)
*G03B 27/58* (2006.01)
*G03B 27/32* (2006.01)

(52) U.S. Cl. .............................. 355/53; 355/72; 355/77

(58) Field of Classification Search ................... 355/53, 355/72, 77
See application file for complete search history.

(56) References Cited

U.S. PATENT DOCUMENTS

| 5,229,872 | A | | 7/1993 | Mumola |
| 5,296,891 | A | | 3/1994 | Vogt et al. |
| 5,523,193 | A | | 6/1996 | Nelson |
| 5,894,056 | A | * | 4/1999 | Kakizaki et al. ............... 430/4 |
| 5,969,441 | A | | 10/1999 | Loopstra et al. |
| 6,046,792 | A | | 4/2000 | Van Der Werf et al. |
| 6,359,678 | B1 | | 3/2002 | Ota |
| 6,940,582 | B1 | * | 9/2005 | Tanaka ........................ 355/53 |
| 2002/0109850 | A1 | | 8/2002 | Takai et al. |

FOREIGN PATENT DOCUMENTS

EP 1 137 054 A1 9/2001

(Continued)

OTHER PUBLICATIONS

European Search Report dated May 12, 2004 for EP 03077013.5.

(Continued)

*Primary Examiner*—Alan A Mathews
(74) *Attorney, Agent, or Firm*—Sterne, Kessler, Goldstein & Fox P.L.L.C.

(57) ABSTRACT

A lithographic apparatus is disclosed. The apparatus includes a radiation system for supplying a beam of radiation, and a support structure for supporting a patterning device. The patterning device serves to pattern the beam of radiation according to a desired pattern. The apparatus also includes a projection system for projecting the patterned beam of radiation onto a target portion of a substrate, and an assembly for determining a spatial position of the patterning device relative to the projection system. The assembly includes a measuring unit that has a plurality of sensors that are mounted on the projection system.

23 Claims, 6 Drawing Sheets

FOREIGN PATENT DOCUMENTS

| | | |
|---|---|---|
| JP | 9-171246 | 6/1997 |
| JP | 11-219900 | 8/1999 |
| WO | WO 98/33096 A1 | 7/1998 |
| WO | WO 98/38597 A2 | 9/1998 |
| WO | WO 98/40791 A1 | 9/1998 |
| WO | WO 01/22480 A1 | 3/2001 |

OTHER PUBLICATIONS

"Photomasks with Integral Laser Mirrors and Calibration of Integral Laser Mirrors on Photomasks," *IBM Technical Disclosure Bulletin*, vol. 32, No. 5b, pp. 19-21, Oct. 1, 1989.

"Improvements to lithographic projection apparatus," *Research Disclosure,* Nov. 2001, pp. 1854-1856.

Japanese Official Action issued for Japanese Patent Application No. 2004-187216, dated Jul. 5, 2007.

\* cited by examiner

Fig 1
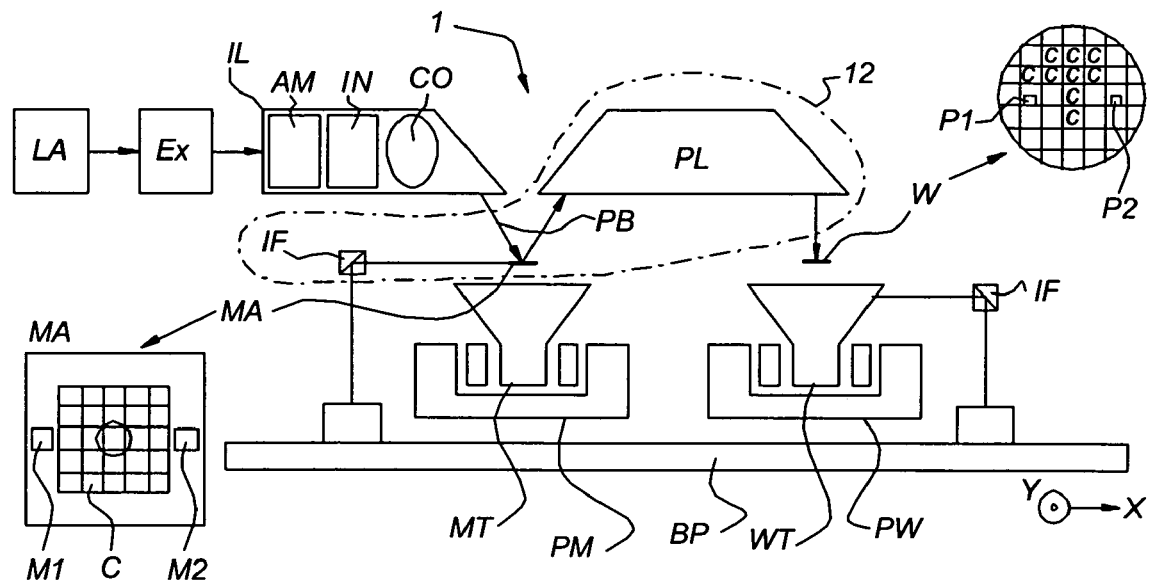
Fig 2 - Prior Art
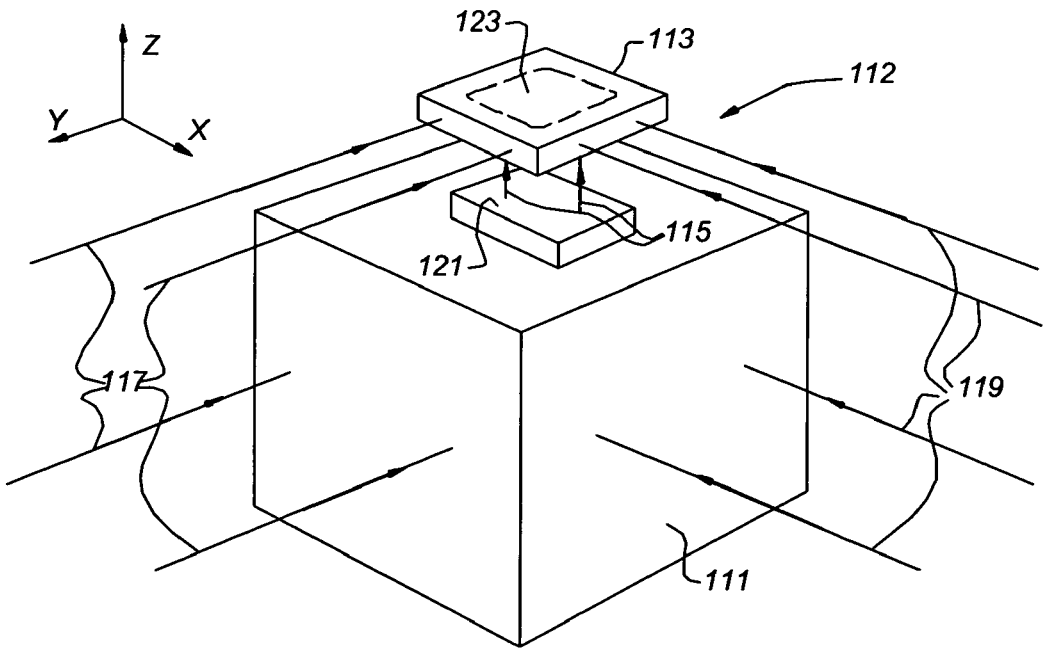

LITHOGRAPHIC APPARATUS WITH PATTERNING DEVICE POSITION DETERMINATION

CROSS-REFERENCE TO RELATED APPLICATIONS

This application claims the benefit of priority from European Patent Application No. 03077013.5, entitled "LITHOGRAPHIC APPARATUS AND INTEGRATED CIRCUIT MANUFACTURING METHOD", filed Jun. 27, 2003, the content of which is incorporated herein by reference in its entirety.

FIELD

The invention generally relates to a lithographic apparatus and an integrated circuit manufacturing method. More specifically, the invention relates to a measurement unit that measures the position of a patterning device.

BACKGROUND

The term "patterning device" as employed above should be broadly interpreted as referring to a device that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning device can include one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to,this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

A lithographic projection apparatus having an assembly for determining a spatial position of the patterning device relative to the projection system is for example known from U.S. Pat. No. 6,359,678. A problem with the assembly disclosed in U.S. Pat. No. 6,359,670 is however, that it is insufficiently accurate in measuring the position of the patterning device relative to the projection system. One of the reasons for this inaccuracy is that variations in the dimensions of the assembly caused by temperature changes, causing in turn thermomechanical stresses, and/or vibrations will influence the measurement of the position of the patterning device relative to the projection system. In particular, measurement errors may be generated by relative rotations between the projection system and the sensors around the x-axis and/or y-axis. Other inaccuracies are introduced by measuring directly on the patterning device with a sensor because of local variations in height and reflections under small angles.

In the November 2001 issue of *Research Disclosure*, an assembly for determining the spatial position of the patterning device relative to a projection system is disclosed in which one sensor is located directly on the projection system. Although the solution presented in this disclosure solves some problems related to the relative rotations between the projection system and the respective sensors, dynamical movements of the patterning device relative to the projection system can only be partly compensated for with this proposed solution.

SUMMARY

It is therefore an aspect of the present invention to provide a lithographic projection apparatus, that includes an assembly for determining more accurately the position of patterning device relative to a projection system. In particular, the invention aims at providing a lithographic projection apparatus including such an assembly that is relatively insensitive to thermomechanical stresses and rotational changes due to dynamical motion.

These aspects may be achieved by a lithographic projection apparatus that includes a support structure that is constructed to hold a patterning device to be irradiated by a projection beam to pattern a projection beam, of radiation. The apparatus also includes a projection system that is constructed and arranged to image an irradiated portion of the patterning device onto a target portion of a substrate and an assembly for determining a spatial position of the patterning device relative to the projection system. The assembly includes a measuring unit with a number of sensors sufficient to determine the spatial position.

In an embodiment, the apparatus includes a radiation system for supplying a beam of radiation; a support structure for supporting the patterning device, the patterning device serving to pattern the beam of radiation according to a desired pattern, a projection system for projecting the patterned beam onto a target portion of a substrate and an assembly for determining a spatial position of the patterning device relative to the projection system, the assembly including a measuring unit having a number of sensors sufficient to determine the spatial position, wherein the number of sensors is mounted on the projection system. In comparison to the present state of the art, this assembly does not need extra construction bars (MF bars), which may result in a number of advantages. The assembly may perform better under vacuum and may entail less contamination risks. Also, the assembly may be less expensive to manufacture. Moreover, swinging of the frame in which the projection system is mounted, does not result in aberrations in position detection. The assembly may have a better short time stability. The assembly is less complex. Furthermore, no frame reference measurement is required. Besides, a strong decrease of parts in the vacuum chamber and consequently lower outgassing rates result. The heat load on the projection system is reduced which means the absence of cooling water which reduces the presence of dynamic disturbance forces. A strong increase of lay out space results around and above the projection system. With all these advantages, the difference in setup of the lithographic apparatus is only marginal.

Mounting of the sensor may, for example, be effected by means of bolts and/or by clamping. The sensor has at least its optical components mounted on the projection system.

In an embodiment, the invention is characterized in that the measuring unit includes a 6 degrees of freedom interferometer measurement system. Interferometric measurement techniques have proven to be reliable, robust and accurate.

In an embodiment, the invention is characterized in that at least one of the sensors uses a laser beam on a reflective part of the patterning device outside a pattern area of the said patterning device. This has the advantage that the radiation used in the position measurement can not be influenced by the pattern of the patterning device. Due to local topography in the pattern and after reflection on that local topography, changes of wave front are generated and thereof measurement errors can occur.

In an embodiment, the invention relates to a lithographic projection apparatus as described above, the patterning device in the lithographic projection apparatus being irradiated along a scanning direction wherein the spatial position of the patterning device relative to the projection system is determined by the use of at least three measurement points in a first plane, the first plane being at an angle to the scanning direction, at least two measurement points on a first line being not in the first plane and at least one point both being not in the first plane and being not on the first line. This results in an accurate determination of the six degrees of freedom of the patterning device.

An embodiment also relates to a method of manufacturing an integrated circuit (IC) by a lithographic process. The method includes: providing a radiation system to form a projection beam of radiation, from radiation emitted by a radiation source, providing a support structure constructed to hold the patterning device, to be irradiated by the projection beam to pattern the projection beam, providing a substrate table constructed to hold a substrate, and providing a projection system constructed and arranged to image an irradiated portion of the patterning device onto a target portion of the substrate, characterized by determining the position of the patterning device relative to the support structure at least once, determining, during operation of the lithographic projection apparatus, the position of the patterning device relative to the projection system, from a measurement of the position of the support structure.

In an embodiment, a method of manufacturing an integrated circuit with a lithographic includes patterning a beam of radiation with a patterning device that is supported by a support structure, projecting the patterned beam of radiation onto a substrate, by use of a projection system, determining the position of the patterning device relative to the support structure at least once, and determining, during operation of the lithographic apparatus, the position of the patterning device relative to the projection system, from a measurement of the position of the support structure.

In an embodiment, a method of manufacturing an integrated circuit with a lithographic apparatus includes patterning a beam of radiation with a patterning device that is supported by a support, imaging the patterned beam of radiation onto a target portion of a substrate with a projection system, measuring a position of the patterning device relative to the support, measuring a position of the support, and determining, during operation of the lithographic apparatus, a position of the patterning device relative to the projection system.

BRIEF DESCRIPTION OF THE DRAWINGS

The invention will now be explained in connection with the accompanying drawing, which are only intended to show examples and not to limit the scope of protection, and in which:

FIG. 1 is a schematic general overview of a lithographic projection apparatus according to an embodiment of the invention;

FIG. 2 is a view of a portion of a lithographic projection apparatus of the prior art;

DETAILED DESCRIPTION

Figure 3:
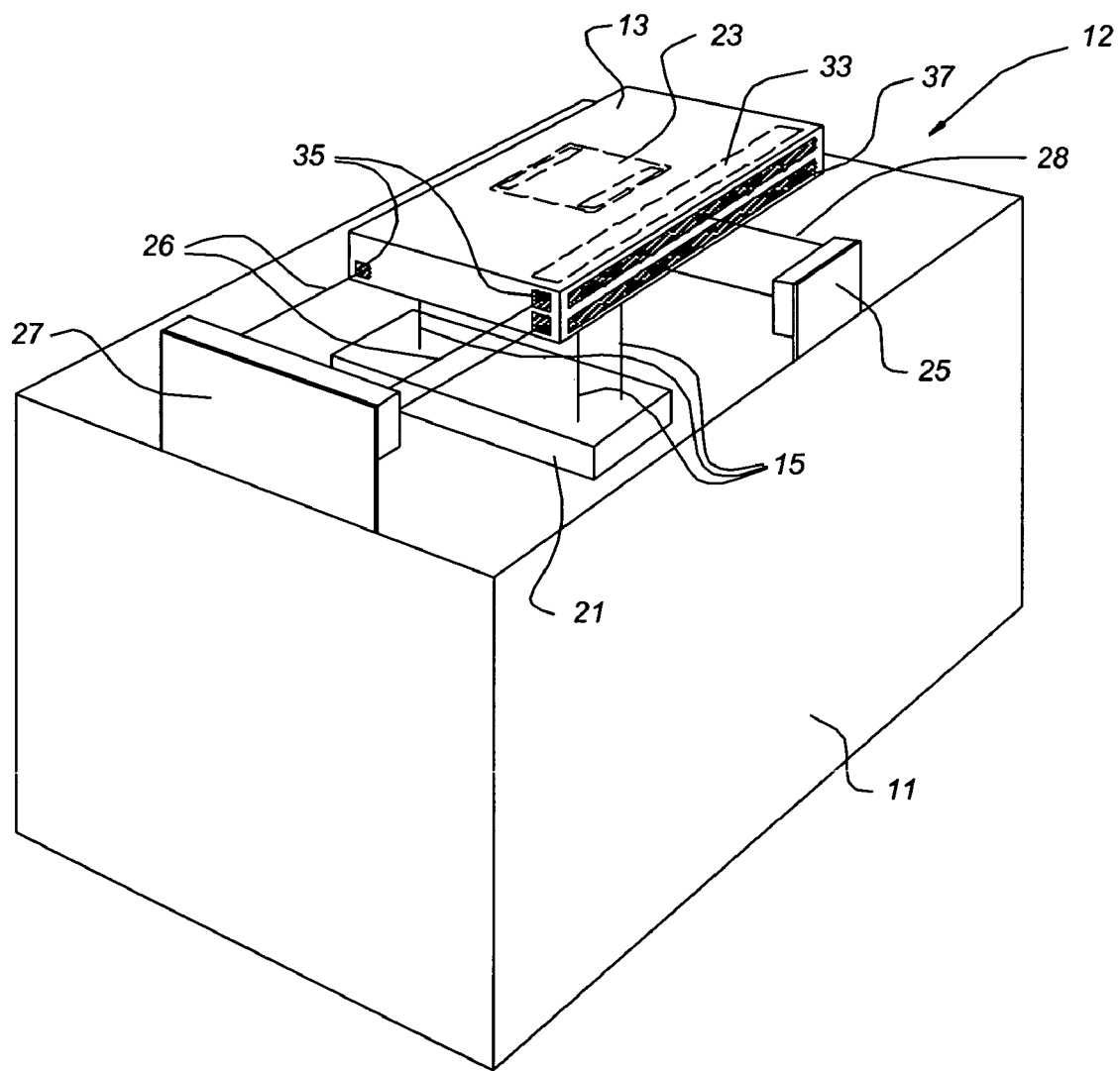
FIG. 3. is a detailed view of a portion of the lithographic projection of FIG. 1.

FIG. 1 schematically depicts a lithographic projection apparatus 1 according to a particular embodiment of the invention.

The apparatus includes: a radiation system Ex, IL, for supplying a projection beam PB of radiation (e.g. EUV radiation with a wavelength of 11-14 nm). In this particular case, the radiation system also includes a radiation source LA; a first object table (mask table) MT provided with a mask holder for holding a mask MA (e.g. a reticle), and connected to a first positioning device PM for accurately positioning the mask with respect to item PL; a second object table (substrate table) WT provided with a substrate holder for holding a substrate W (e.g. a resist coated silicon wafer), and connected to a second positioning device PW for accurately positioning the substrate with respect to item PL; and a projection system ("lens") PL for imaging an irradiated portion of the mask MA onto a target portion C (e.g. comprising one or more dies) of the substrate W. The term object table as used herein can also be considered or termed as an object support. It should be understood that the term object support or object table broadly refers to a structure that supports, hold, or carries an object.

As here depicted, the apparatus is of a reflective type (i.e. has a reflective mask). However, in general, it may also be of a transmissive type, for example, with a transmissive mask. Alternatively, the apparatus may employ another kind of patterning device, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having a traversed conditioning device, such as a beam expander Ex, for example. The illuminator IL may include an adjusting device AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and an interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution. In FIG. 1, an assembly 12 for determining a spatial position of the patterning device relative to the projection system forming a portion of the lithographic projection apparatus 1 is shown. The assembly 12 is further explained with reference to FIG. 3.

In the following explanation, a Cartesian coordinate frame is used having a y-direction parallel to the scanning direction in the lithographic projection apparatus 1.

In FIG. 2, an assembly 112 for determining the position of a patterning device (reticle) 123 relative to a part 111 that contains projection optics is shown. The part 111 is also referred to as projection system 111 or assembly of "lenses" 111. The reticle 123 is mounted underneath a reticle stage 113. A reticle 123 is not visible in FIG. 2 and therefore is drawn with a dashed line. In the z direction, laser beams 115 from a sensor 121 are directed from the part 111 to the reticle 123. In the x direction, laser beams 117 are directed to the part 111 and the reticle stage 113. In the y direction, laser beams 119 are directed to the part 111 and the reticle 113. In FIG. 2, it is indicated that the laser beams 117 and 119 are directed in pair towards the assembly 112. Theoretically, a single beam 117, 119 could be used but for practical reasons a pair of beams is used.

The position of the reticle 123 relative to the part 111 is determined from the z measurement directly on the reticle 123. The position of the reticle 123 relative to the part 111 in the x direction and y direction is derived from the measurements by the laser beams 117 and 119. This is possible because the position of the reticle 123 on the reticle stage 113 in the xy plane, is known. The sensors from which the laser beams 117 and 119 originate, are not located on the part 111.

In FIG. 3, an assembly 12 of FIG. 1 for determining the position of a reticle 23 relative to a part 11 that contains projection optics in accordance with an embodiment of the invention is shown. Sensors 27 and 25 are mounted on the part 11, and directly measure the position of the reticle stage 13. Laser beams 26 and 28 are used for these measurements. Two paired laser beams make up one measurement point. For reasons of clarity, such a paired laser beam is indicated with only one line, as is the case, for example, with the laser beams 28 (i.e. a total of 4) of sensor 25.

In the arrangement of FIG. 3, the assembly 12 includes a sensor 21 that differs from sensor 121 shown in FIG. 2. The sensor 21 produces three pair of laser beams instead of two pair. Two of those three pair are directed to two reflecting strips on reticle 23, and one pair is directed to a reflecting strip 33 on the bottom side of reticle stage 13, as will be further explained below with reference to FIG. 4. Moreover, there are two pair of laser beams 28 produced by sensor 25 and three pair of laser beams 26 by sensor 27, as will be explained in detail with reference to FIG. 5.

During operation of the lithographic projection apparatus 1, the reticle 23 is illuminated by a radiation source. The sensor 21 is arranged in such a way that it uses its laser beams 15 determining the z position of the reticle 23 and reticle stage 13. In this way the x, y and z-positions of the reticle stage 13 are measured using sensors directly connected to the part 11. Since the position of the reticle 23 relative to the reticle stage 13 is known, from this measurement the x and y position of the reticle 23 relative to the assembly of lenses 11 follow as well. In an embodiment, determining the z position of the reticle 23 relative to the part 11 is done by measuring the distance from a part of the reticle 23 outside the radiation beam and outside the patterned area at least once. Then, it is further assumed that the z position of the reticle 23 relative to the reticle stage 13 does not change during scanning. Consequently, there is no need to monitor the z position of the reticle 23 continuously during operation of the lithographic projection apparatus 1.

As will be appreciated by a person of ordinary skill in the art, information about the position of the reticle 23 may be derived from the sensors 21, 25 and 27 positioned in a different manner than shown in FIG. 3. For example, the sensors 25 and 27 may be integrated into one sensor that is able to determine the same positional information as the sensors 25 and 27 individually.

Figure 4:
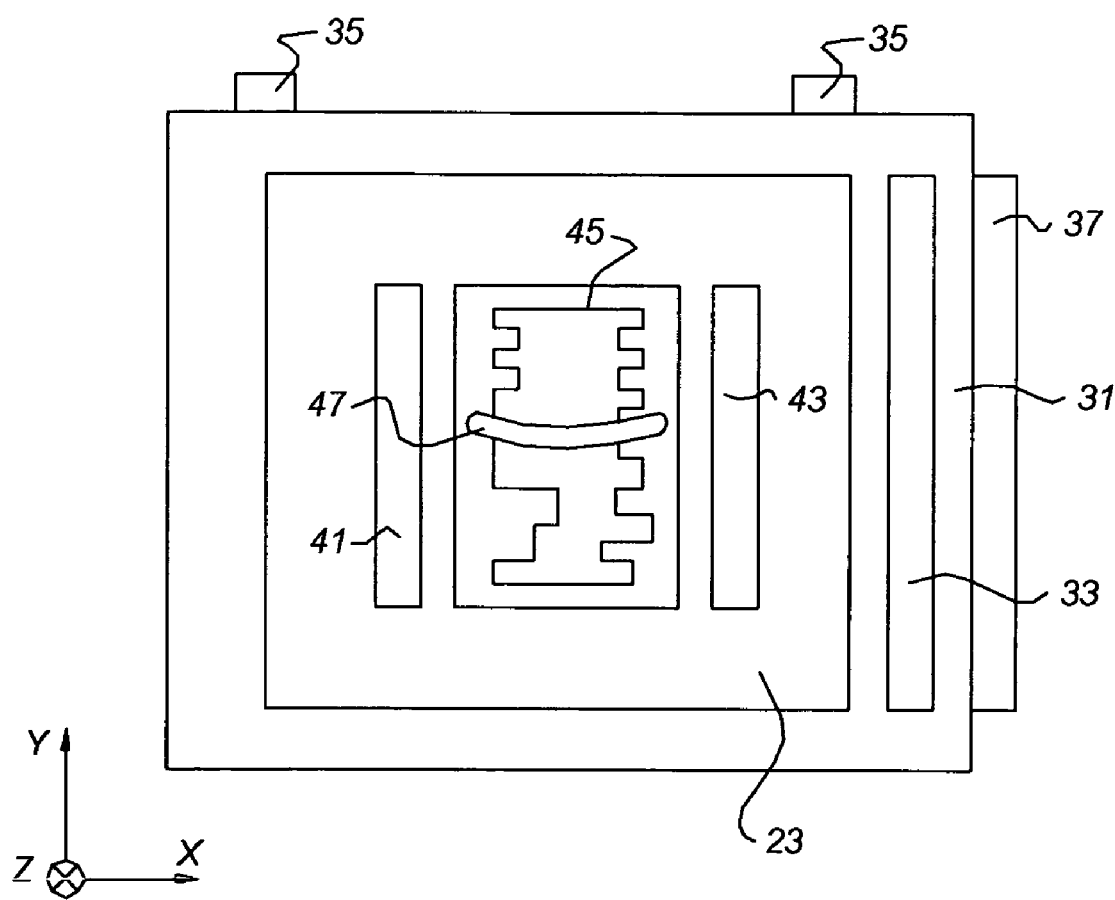
FIG. 4 is a top view of a reticle stage (RS) chuck with a reticle, as shown in FIG. 3.

FIG. 4 shows a reticle stage chuck (RS chuck) 31 in bottom view. The RS chuck 31 includes the reflecting parts 33, 35 and 37. The reticle 23 is attached to the RS chuck 31 in a way known in the art. Two additional reflecting strips 41, 43, located outside the mask area, are present on the on the reticle 23. A pattern is present on the reticle 23, indicated by reference numeral 45 and reference numeral 47 indicates a radiation beam scanning along the pattern 45, as is known to persons skilled in the art.

Contrary to the assembly 112 shown in FIG. 2, all of the reflecting strips 33, 41, 43 are outside the pattern, so are outside the area illuminated by projection beam PB during operation. This prevents any detrimental effect by the pattern to the three pair of laser beams 15, that can influence measurement accuracy of the derived information out of the beams.

The sensors 21, 25, 27 direct their respective laser beams 15, 28, 26 towards the reflecting parts 33, 35 and 37. The reflected laser beams give information about the position of the RS chuck 31 relative to the projection system 11 of FIG. 3. The reflective parts 33, 37 and 35 reflect light in the z, x and y direction of a reference coordinate frame respectively.

Figure 5:
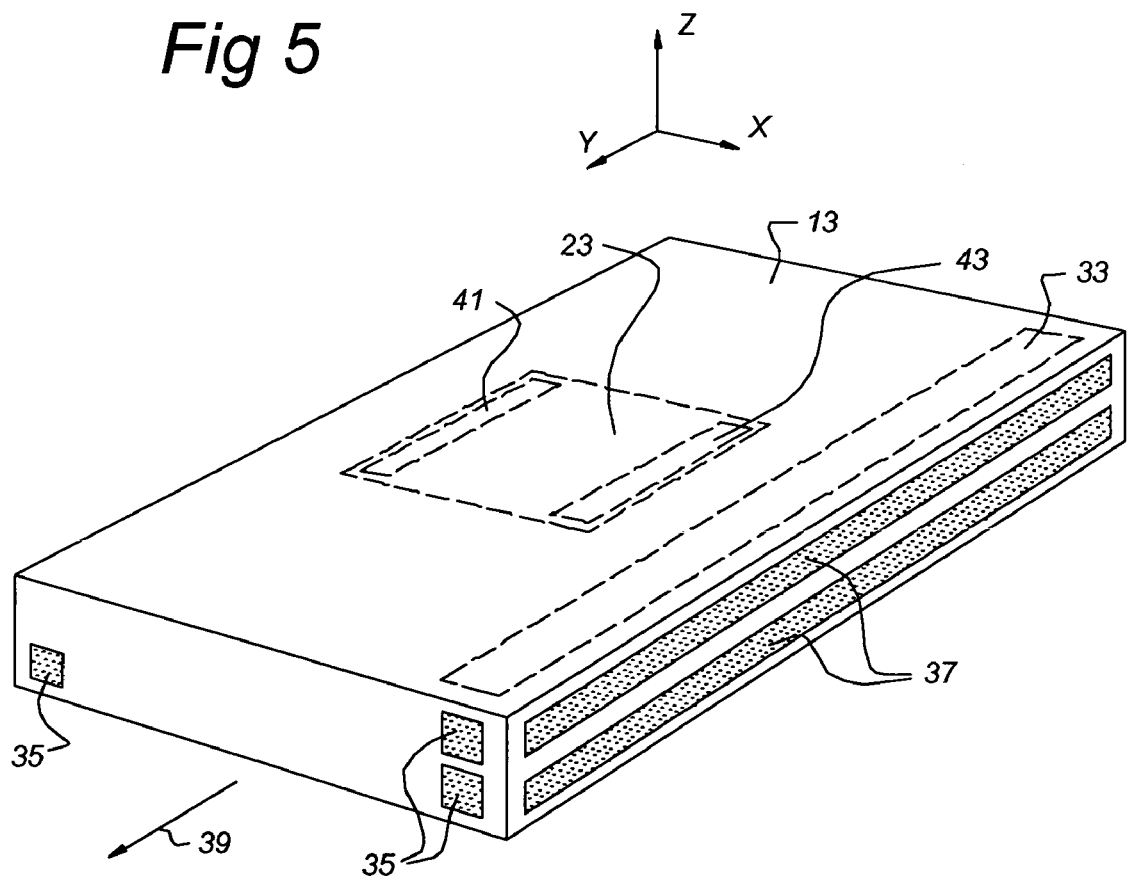
FIG. 5 is a perspective view of the reticle stage chuck of FIGS. 3 and 4.

In FIG. 5, the reticle stage chuck 31 is shown in perspective. This figure serves to further illustrate the way the invention functions. In the x-direction, reflecting strips 37 are attached to the reticle stage chuck 31. In the y-direction, the scanning direction as indicated by an arrow 39, reflecting surfaces 35 shaped in the form of spots are attached to the reticle stage chuck 31. Reflecting strip 33 for light propagating in the z-direction is attached at the bottom of the reticle stage chuck 31 and, as it cannot be seen directly in the perspective view of FIG. 5, indicated with a dashed line. The same applies to the reticle 23 itself and the reflecting strips 41 and 43 on the reticle 23.

The reason that the reflecting surfaces 35 in the y-direction are tiny spots is that the movement of the reticle stage chuck 31 in the x-direction during operation of the lithographic projection apparatus 1 will be marginal. On the contrary, reflecting strips 37 are needed in the x direction since the movement of the reticle stage chuck in the y direction is substantial. A much more extensive movement has to be covered by the reflecting strips 37 in order to ensure a proper reflection of the laser beams 28 that are directed towards these reflecting strips 37 during the period in which exposure light is present on the mask. The length during which exposure light is present on the mask is the sum of the pattern length and the slit length in the y-direction.

Since a total of six pairs of laser beams are used, a 6 degrees of freedom (6 DOF) interferometer measurement system is provided. Since there are three pairs of laser beams in the y-direction and two pair in the x-direction, the laser beams 28 and 26 together no only provide information about the position of the reticle stage 13 in the x- and y-direction, but also provide information about the tilt in the x-direction (Ry, i.e., a rotation about the y-axis), the tilt in the y-direction (Rx, i.e., a rotation about the x-axis), and the rotation about the z-axis (Rz). To that end, the three reflecting parts 35 may not be located on a straight line. Preferably, they are located on the three corners of a right-angled triangle.

Figure 6A:
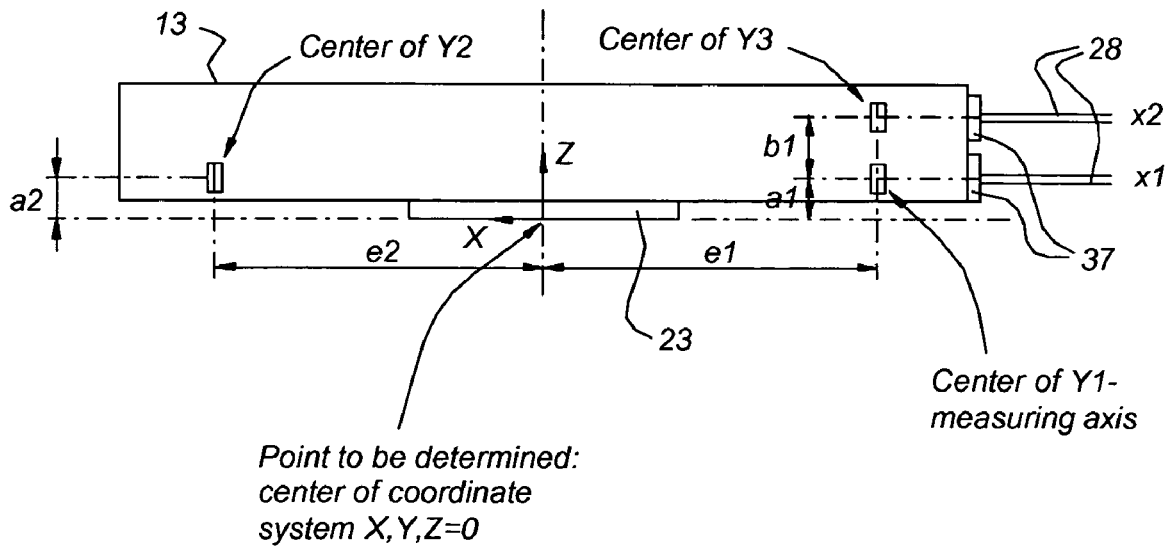
FIGS. 6a, 6b and 6c are side-views of the reticle stage shown in the FIGS. 3-5.
Figure 6B:
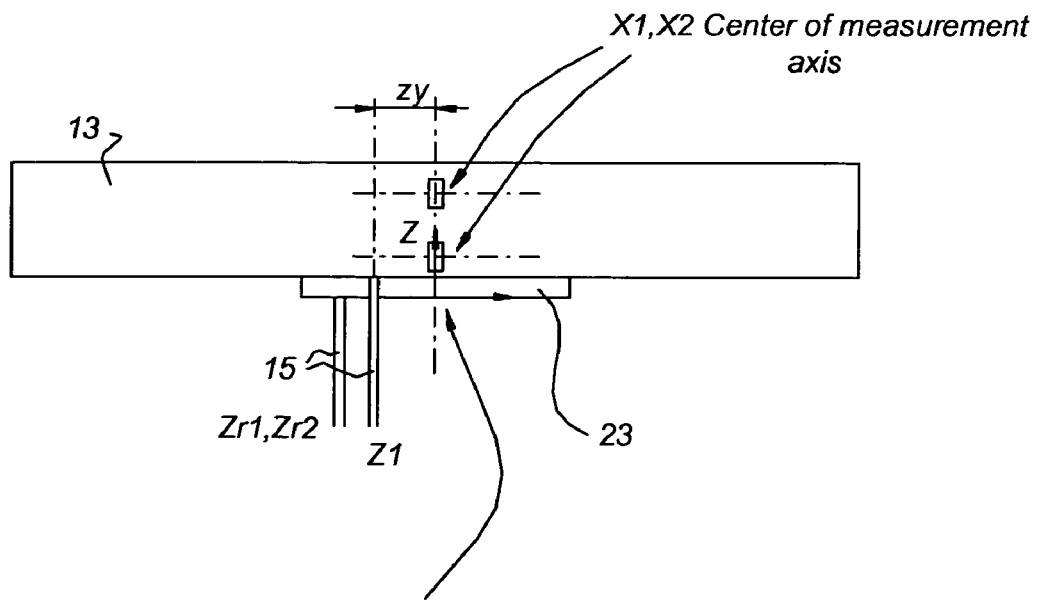
Figure 6C:
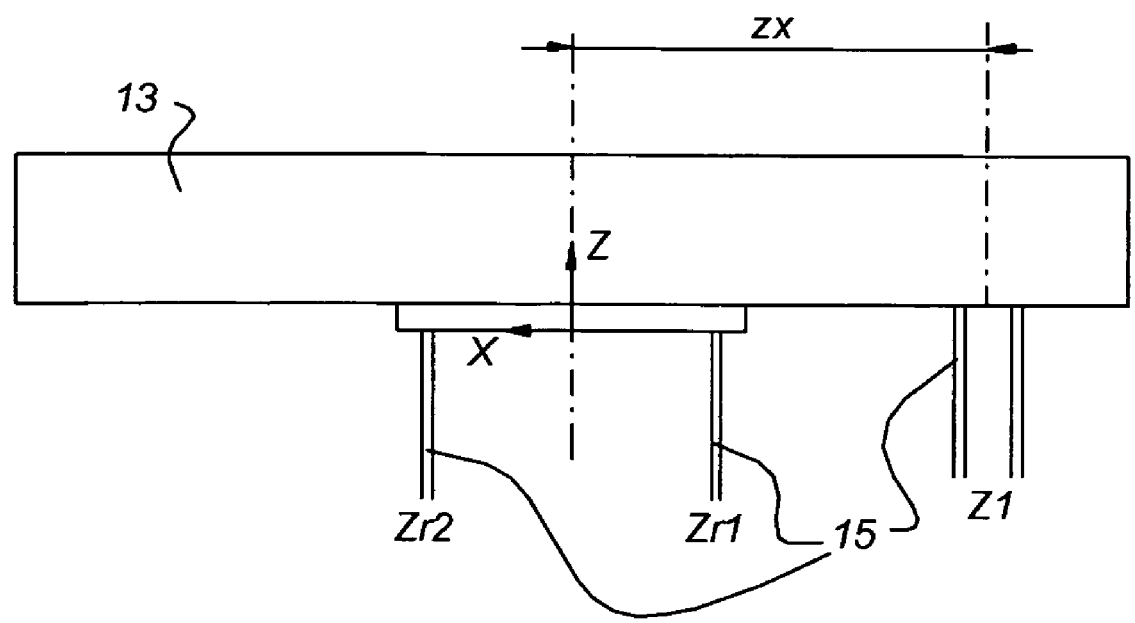

FIGS. 6a, 6b, and 6c schematically show cross sections through the reticle stage chuck 31. They show views in the y-direction, the x-direction and again the y-direction, respectively, to define various parameters and variables that can be used to calculate the exact position of reticle 13. The parameters and variables shown have the following meaning:

x1=x position as measured by one of the two pair of beams 28;

x2=x position as measured by the other one of the two pair of beams 28;

y1, y2, y3=y positions as measured by one of the three pair of beams 26, respectively;

z1=z position as measured by beam 15 that is directed to reflecting strip 33;

zr1, zr2=z positions as measured by beams 15 directed to reflecting strips 41, 43; these positions are measured non real-time; and a1, a2, b1, e1, e2, zx, zy=predetermined constants as defined in FIGS. 6a, 6b, 6c.

The position x, y, z of the reticle stage chuck 31 may be determined from the distances measured by the laser beams 15, 28, 26 relative to a reference point according to the following general formulae, which represent an ideal case. With reflecting strips/surface, small cosine dependent corrections should be added:

$$x = x1 + Ry*a1$$

$$y = \{(y1+y2)/2\} + \{Rx*(a1+a2)/2\}$$

$$z = z1 + Rx*zy + Ry*zx$$

$$Rx = (y1-y3)/b1$$

$$Ry = (x1-x2)/b1$$

$$Rz = (y1-y2)/(e1+e2)$$

The laser beams may have one common origin or may be generated by independent individual laser sources. The additional reflecting strips 41 and 43 may be used to determine non real-time, the position in the z direction and the Ry orientation of the reticle 39 itself relative to the reference point. Because of the limited stroke in x-direction and z-direction, reflection parts 35 may also consist of 3 cube corners as reflectors.

While specific embodiments of the invention have been described above, it will be appreciated that the invention may be practiced otherwise than as described. The description is not intended to limit the invention.

What is claimed is:

1. A lithographic projection apparatus comprising:
a support structure configured to hold a patterning device, the patterning device configured to pattern a beam of radiation according to a desired pattern;
a projection system configured to project the patterned beam of radiation onto a target portion of a substrate; and
an assembly configured to determine a spatial position of said patterning device relative to said projection system, said assembly comprising a measuring unit having a plurality of sensors mounted on the projection system,
wherein the measuring unit is configured to direct a beam of radiation onto a part of the patterning device outside and adjacent a pattern area of the patterning device.

2. A lithographic projection apparatus according to claim 1, further comprising an EUV radiation source.

3. A lithographic projection apparatus according to claim 1, wherein said measuring unit comprises a 6 degrees of freedom interferometer measurement system.

4. A lithographic projection apparatus according to claim 1, wherein at least one of said sensors is configured to use a laser beam on a reflective part of said patterning device outside a pattern area of said patterning device.

5. A lithographic projection apparatus according to claim 1, configured to irradiate the patterning device along a scanning direction, and to determine the spatial position of said patterning device relative to said projection system by the use of at least three measurement points in a first plane, the first plane being at an angle to the scanning direction, at least two measurement points on a first line being not in the first plane, and at least one point both being not in the first plane and being not on the first line.

6. A lithographic projection apparatus according to claim 5, wherein said measurement points are located on said support structure.

7. A lithographic projection apparatus according to claim 5, wherein at least two measurement points are located on the patterning device outside a pattern area of said patterning device.

8. A lithographic projection apparatus according to claim 4, wherein the reflective part is a reflective strip.

9. A lithographic projection apparatus according to claim 1, wherein the measuring unit is configured to determine a position of the patterning device in a first direction with respect to the projection system, the first direction being substantially perpendicular to the plane of a pattern area of the patterning device when held by the support structure.

10. A lithographic projection apparatus according to claim 1, wherein the part is reflective and the pattern area and the part are on the same side of the patterning device.

11. A lithographic projection apparatus comprising:
a support structure configured to hold a patterning device, the patterning device configured to pattern a beam of radiation according to a desired pattern;
a projection system configured to project the patterned beam of radiation onto a target portion of a substrate; and a measuring unit configured to direct a beam of radiation onto a part of the patterning device outside and adjacent a pattern area of the patterning device when held by the support structure and to determine, using the beam, a position of the patterning device in a first direction, the first direction being substantially perpendicular to the plane of a pattern area of the patterning device when held by the support structure.

12. A lithographic projection apparatus according to claim 11, wherein the part is reflective and the pattern area and the part are on the same side of the patterning device.

13. A lithographic projection apparatus according to claim 11, wherein the measuring unit is configured to direct the beam in the first direction.

14. A lithographic projection apparatus according to claim 11, wherein the measuring unit is mounted on the projection system.

15. A lithographic projection apparatus according to claim 11, wherein the measuring unit is configured to direct at least two pairs of beams of radiation to at least two reflective strips on the patterning device.

16. A lithographic projection apparatus comprising:
a support structure configured to hold a patterning device, the patterning device configured to pattern a beam of radiation according to a desired pattern;
a projection system configured to project the patterned beam of radiation onto a target portion of a substrate; and
a measuring unit on the projection system, the measuring unit configured to direct a beam of radiation onto a part of the patterning device outside and adjacent a pattern area of the patterning device.

17. A lithographic projection apparatus according to claim 16, further comprising an EUV radiation source.

18. A lithographic projection apparatus comprising:
a support structure configured to hold a patterning device, the patterning device configured to pattern a beam of radiation according to a desired pattern;
a projection system configured to project the patterned beam of radiation onto a target portion of a substrate; and
a measuring unit configured to measure a position of the patterning device when held by the support structure at least once before an exposure using the patterning device, determine the position of the patterning device relative to the support structure using the measurement of the position of the patterning device, and determine, during exposure using the patterning device, a position of the patterning device relative to the projection system from a measurement of the position of the support structure,
wherein the measuring unit is configured to direct a beam of radiation onto a part of the patterning device outside and adjacent a pattern area of the patterning device, the pattern area and the part being on the same side of the patterning device.

19. A lithographic projection apparatus according to claim 18, wherein the measuring unit is configured to direct a beam of radiation onto a part of the patterning device outside a pattern area of the patterning device and determine, using the beam, a position of the patterning device in a first direction, the first direction being substantially perpendicular to the plane of a pattern area of the patterning device when held by the support structure.

20. lithographic projection apparatus according to claim 18, wherein the measuring unit comprises a plurality of sensors mounted on the projection system.

21. A lithographic projection apparatus comprising:
a support structure configured to hold a patterning device, the patterning device configured to pattern a beam of radiation according to a desired pattern;
a projection system configured to project the patterned beam of radiation onto a target portion of a substrate; and
a measuring unit configured to measure a position of the patterning device when held by the support structure, determine the position of the patterning device relative to the support structure using the measurement of the position of the patterning device, measure a position of the support structure, and determine, during operation of the lithographic apparatus, a position of the patterning device relative to the projection system,
wherein the measuring unit is configured to direct a beam of radiation onto a part of the patterning device outside and adjacent a pattern area of the patterning device.

22. A lithographic projection apparatus according to claim 21, wherein the measuring unit is mounted on the projection system and the measuring unit is configured to determine, using the beam, a position of the patterning device in a first direction, the first direction being substantially perpendicular to the plane of a pattern area of the patterning device when held by the support structure.

23. A lithographic projection apparatus according to claim 22, further comprising an EUV radiation source.

* * * * *